(12) United States Patent
Lavallée et al.

(10) Patent No.: US 6,777,167 B2
(45) Date of Patent: Aug. 17, 2004

(54) METHOD OF PRODUCING AN ETCH-RESISTANT POLYMER STRUCTURE USING ELECTRON BEAM LITHOGRAPHY

(76) Inventors: Éric Lavallée, 1407 Magellan, Apt. #5, Rock Forest, Quebec (CA), J1N 3S3; Jacques Beauvais, 1961 Albert Skinner, Sherbrooke, Quebec (CA), J1N 1X3; Dominique Drouin, 290 Pariseau, Deauville, Quebec (CA), J1N 3N9; Mëlanie Cloutier, 1950 du Montagnais, Apt. #407, Sherbrooke, Quebec (CA), J1K 2X9

( * ) Notice: Subject to any disclaimer, the term of this patent is extended or adjusted under 35 U.S.C. 154(b) by 168 days.

(21) Appl. No.: 10/103,643

(22) Filed: Mar. 20, 2002

(65) Prior Publication Data

US 2003/0180627 A1 Sep. 25, 2003

(30) Foreign Application Priority Data

Mar. 15, 2002 (CA) ............................................. 2377081

(51) Int. Cl.⁷ .............................. G03F 9/00; G03F 5/00
(52) U.S. Cl. ........................... 430/296; 430/5; 430/313; 430/323
(58) Field of Search ............................. 430/5, 311, 312, 430/313, 314, 316, 317, 318, 296, 323

(56) References Cited

U.S. PATENT DOCUMENTS

| | | | |
|---|---|---|---|
| 3,770,433 A | 11/1973 | Bartlett et al. ................. | 96/36 |
| 3,916,035 A | 10/1975 | Brewer ......................... | 427/43 |
| 4,269,962 A | 5/1981 | Kalal .......................... | 526/273 |
| 4,386,152 A | 5/1983 | Lai ............................. | 430/269 |
| 5,918,143 A | 6/1999 | Beauvais et al. ........... | 438/607 |

OTHER PUBLICATIONS

S. Mackie, et al., "Materials and Processes for Nanometer Lithography", Solid State Technology, vol. 28, Aug. 1985, pp. 117–122.

H.G. Craighead, et al., "10" nm Linewidth Electron Beam Lithography on GaAs", Applied Physics Letters, vol. 42(1), Jan. 1983, pp. 38–40.

(List continued on next page.)

*Primary Examiner*—Mark F. Huff
*Assistant Examiner*—Saleha Mohamedulla
(74) *Attorney, Agent, or Firm*—Darby & Darby

(57) ABSTRACT

The present invention relates to a method of producing a structure of etch-resistant polymer on a substrate. A layer of sterol capable of polymerizing to form this structure is first deposited on a face of the substrate. Then, a first region of the layer of sterol is exposed to an electron beam to locally polymerize this layer and form the structure of etch-resistant polymer. A second region of the layer of sterol that has not been exposed to the electron beam is removed to leave on the face of the substrate only the structure of etch-resistant polymer. Finally, a region of the face of the substrate not covered by the structure of etch-resistant polymer can be etched away, and the structure of etch-resistant polymer removed following this etching.

9 Claims, 3 Drawing Sheets

OTHER PUBLICATIONS

D.M. Tanenbaum, et al., "High Resolution Electron Beam Lithography Using ZEP–520 and KRS Resists at Low Voltage", Journal of Vacuum Science and Technology, B14(6), vol. 14, No. Dec. 1996, pp. 3829–3833.

J. Fujita, et al., "Ultrahigh Resolution of Calixarene Negative Resist in Electron Beam Lithography", Applied Physics Letters, vol. 68(9), Feb. 1996, pp. 1297–1299.

T.H.P. Chang et al., "Nanostructure Technology", IBM Journal of Research and Development, vol. 32, No. 4, Jul. 1988, pp. 462–492.

V.N. Bagratashvili, et al., "Macroparticle Distribution and Chemical Composition of Laser Deposited Apatite Coatings", Applied Physics Letters, vol. 66 (19), May 1985, pp. 2451–2453.

D. Drouin et al., "Method of Fabricating Submicron Silicide Structures on Silicon Using a Resistless Electron Beam Lithography Process", Applied Physics Letters, vol. 70 (22), Jun. 1997, pp. 3020–3023.

W. Langheinrich, et al., "Fabrication of Metallic Structures in the 10 nm Region Using an Inorganic Electron Beam Resist", Jpn. Journal of Applied Physics, vol. 32, Dec. 1993, pp. 6218–6223.

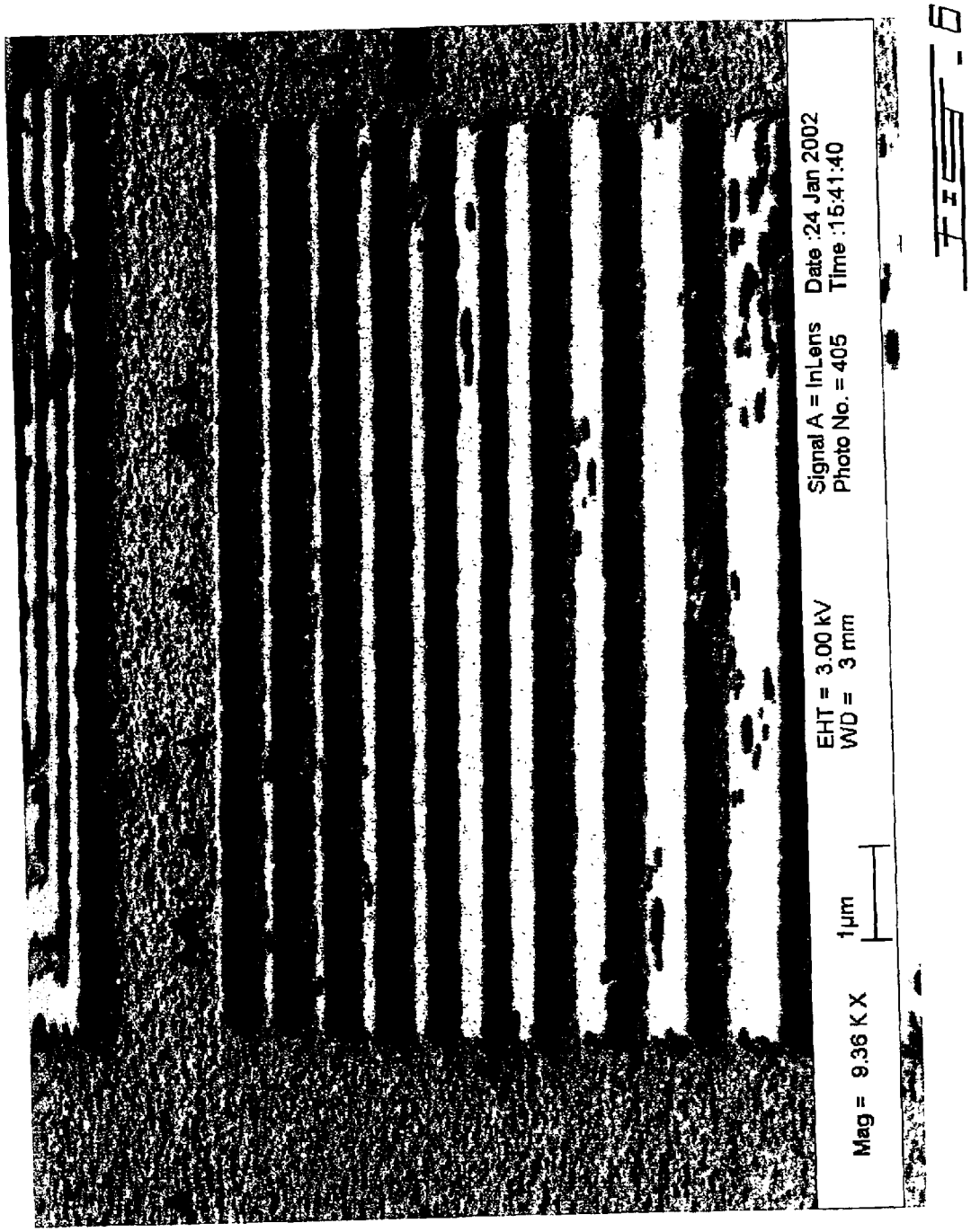

METHOD OF PRODUCING AN ETCH-RESISTANT POLYMER STRUCTURE USING ELECTRON BEAM LITHOGRAPHY

FIELD OF THE INVENTION

The present invention relates to a method of producing an etch-resistant polymer structure on a substrate using electron beam lithography.

More specifically, the present invention is concerned with the use of an electron beam to locally polymerize a layer of sterol deposited on a substrate to produce the etch-resistant polymer structure.

BACKGROUND OF THE INVENTION

The fabrication of ultra-small scale semiconductor devices requires very high-resolution lithography techniques. The most frequent high-resolution lithography technique involved in such fabrication is the so-called polymeric resist-based lithography. PMMA (Poly(Methyl Methacrylate)) is a polymer that is currently used in the fabrication of such devices using electron beam lithography ["*Materials and processes for nanometer lithography*", S. Mackie, S. P. Beaumont, *Solid State Technology*, vol. 28, August 1985, pp. 117–122]. This polymer is known mainly for its positive tone resist behavior, which allows the selective dissolution of the regions exposed to the electron beam while leaving intact the unexposed regions. Features with resolutions as small as 10 nm have been demonstrated with PMMA ["10 *nm linewidth electron beam lithography on GaAs*" H. G. Craighead, R. E. Howard, L. D. Jackel, P. M. Mankiewich, *Applied Physics Letters*, vol. 42, January 1983, pp. 38–40] and other comparable resists. However, fabrication of some semiconductor devices requires negative tone resists, in which the regions unexposed to the electron beam are dissolved while the exposed regions are left intact. Since the area to be exposed by the electron beam is smaller in the case of low-density patterns, negative tone resists reduce the exposure time, a major issue in large-scale device fabrication such as monolithic integrated circuits or in the case of clear field photomask fabrication using electron beam lithography.

Negative resists are common in microelectronics applications, as described in the following patents and articles:

"High sensitivity negative electron resist", U.S. Pat. No. 3,770,433 (Bartlett et al.) issued on Nov. 6, 1973;

"Plasma developable electron resist process", U.S. Pat. No. 4,386,152 granted to Juey H. Lai on May 31, 1983;

"High resolution electron beam lithography using ZEP-520 and KRS resists at low voltage", D. M. Tanenbaum, C. W Lo, M. Isaacson, H. G. Craighead, M. J. Rooks, K. Y Lee, W. S. Huang, T. H. P. Chang, *Journal of Vacuum Science and Technology B*, vol. 14, November/December 1996, pp. 3829–3833; and "Ultrahigh resolution of calixarene negative resist in electron beam lithography", J. Fujita, Y. Ohnishi, Y. Ochiai, S. Matsui, *Applied Physics Letters*, vol. 68, February 1996, pp. 1297–1299.

In several negative resists, the electron beam is used to break bonds of the polymeric chains. This leaves free radicals to create cross-linking between the chains, and generates a non-soluble organic compound in the area exposed to the electron beam ["Epoxy-polymer electron beam resists", U.S. Pat. No. 3,916,035 (Brewer) issued on Oct. 28, 1975]. The resolution of both positive and negative tone resists is limited since the polymeric nature of the electron sensitive layer and the molecular dynamic behavior of the development process remove complete polymer chains. The polymer chains are entangled in a random manner, and the dimensions of the entanglement structure of the polymer as well as the diameter of the broken and disentangled polymeric chains are usually of the order of 5 nm (["Electron resist", U.S. Pat. No. 4,269,962 granted to J. Kalal, B. Bednar, J. Zachoval, J. Petr, Z. Pelcbauer and F. Svec on May 26, 1981] and ["*Nanostructure technology*", T. H. P. Chang, D. P. Kem, E. Kratschmer, K. Y Lee, H. E. Luhn, M. A. McCord, S. A. Rishton, Y. Vladimirsky, *IBM Journal of Research and Development*, vol. 32, July 1988, pp. 462–492]). This impairs the achievement of structures with better resolution and smaller line edge roughness.

Another drawback of both the positive and negative tone resists currently available is the incompatibility of such resists with biological tissues. Of course, devices to be implanted in the human body such as cochlear implants, ocular implants and pain-suppressing implants are designed to come into direct contact with human organs. To obtain biocompatible devices, the electron-sensitive layers used for the patterning of the device elements must also be biocompatible. Otherwise, a thick encapsulating layer of biocompatible material has to be deposited on the devices to form a barrier for non-biocompatible material ["*Macroparticle distribution and chemical composition of laser deposited apatite coatings*", V. N. Bagratashvili, E. N. Antonov, E. N. Sobol, V. K Popov, S. M. Howdle, *Applied Physic Letters*, vol. 66, May 1985, pp. 2451–2453]. The presence of such an encapsulating layer obviously constitutes a limitation to the fabrication of some devices.

Finally, the most important drawback is the need for spin-coating such resists. Spin coating requires mostly flat surfaces with low relief. Abrupt and/or high structures on the surface of the substrate produces an uneven spun resist. This causes reduction in the achievable resolution. Recently, a method has been developed for fabricating an etch resistant metal/semiconductor compound using direct-write electron beam exposure (["Fabrication of sub-micron suicide structures on silicon using resistless electron beam lithography", U.S. Pat. No. 5,918,143 granted to J. Beauvais, D. Drouin and E. Lavallée on Jun. 29, 1999] and ["*Method for fabricating submicron suicide structures on silicon using a resistless electron beam lithography process*", D. Drouin, J. Beauvais, R. Lemire, and E. Lavallée, R. Gauvin, M. Caron, *Applied Physics Letters*, vol. 70, June 1997, pp. 3020–3023]. According to this method, the electron-sensitive layer can be evaporated on top of the substrate prior to electron beam exposure. Similar results have been attained using electron sensitive inorganic layers ["*Fabrication of metallic structures in the 10 nm region using an inorganic electron beam resist*", W Langheinrich, H. Beneking, *Japanese Journal of Applied Physics*, vol. 32, December 1993, pp. 6218–6223]. However, the sensitivity of such resists remains low, therefore restraining the use of this process to applications requiring low throughput such as mask fabrication.

SUMMARY OF THE INVENTION

In accordance with the present invention, there is provided a method of producing a structure of etch-resistant polymer on a substrate, comprising:

(a) depositing on a face of the substrate a layer of sterol capable of polymerizing to form the structure of etch-resistant polymer;

(b) exposing a first region of the layer of sterol to an electron beam to locally polymerize the layer of sterol and form the structure of etch-resistant polymer; and (c) removing a second region of the layer of sterol which has not been exposed to the electron beam to leave on the face of the substrate only the structure of etch-resistant polymer.

The present invention also relates to a method of producing on a substrate a mask for lithography, comprising:

(a) depositing on a face of the substrate a radiation-absorbing layer;

(b) depositing on the radiation-absorbing layer a layer of sterol capable of polymerizing;

(c) exposing a first region of the layer of sterol to an electron beam to locally polymerize the layer of sterol and form a structure of etch-resistant polymer;

(d) removing a second region of the layer of sterol which has not been exposed to the electron beam to leave on the radiation-absorbing layer only the structure of etch-resistant polymer; and (e) etching from the face of the substrate a region of the radiation-absorbing layer not covered by the structure of etch-resistant polymer.

The invention still further relates to a method of producing on a substrate a mask for X-ray lithography, comprising:

(a) depositing on a face of the substrate a first layer of etch-resistant material forming a first barrier to a particular etching process;

(b) depositing on the first layer a second layer of X-ray absorbing material;

(c) depositing on the second layer a third layer of etch-resistant material forming a second barrier to the particular etching process;

(d) depositing on the third layer a layer of sterol capable of polymerizing;

(e) exposing a first region of the layer of sterol to an electron beam to locally polymerize the layer of sterol and form a structure of etch-resistant polymer;

(f) removing a second region of the layer of sterol which has not been exposed to the electron beam to leave on the third layer only the structure of etch-resistant polymer;

(g) etching a region of the third layer not covered by the structure of etch-resistant polymer; and (h) removing, by means of said particular etching process, a region of the second layer not covered by the structure of etch resistant polymer.

The foregoing and other objects, advantages and features of the present invention will become more apparent upon reading of the following non restrictive description of illustrative embodiments thereof, given by way of example only with reference to the accompanying drawings.

BRIEF DESCRIPTION OF THE DRAWINGS

In the appended drawings, in which like reference numerals correspond to like elements throughout the figures:

FIG. 6 is a micrograph showing elements of a X-ray mask prototype fabricated using a layer of cholesterol to pattern a layer of nickel, then the layer of nickel to pattern a tantalum absorber, this micrograph being taken at an angle of 70° with respect to the normal.

DESCRIPTION OF THE ILLUSTRATIVE EMBODIMENT

With reference to the appended drawings an illustrative embodiment of the present invention will now be described.

FIGS. 1, 2, 3 and 4 illustrate various steps of a method of producing an etch-resistant polymer structure on a substrate using electron beam lithography.

Figure 1:
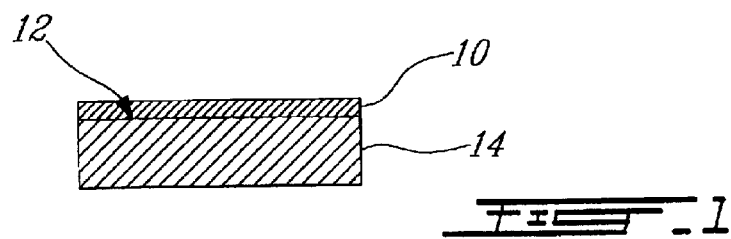
FIG. 1 is a cross sectional view of a substrate on which a layer (or film) of sterol has been deposited.

Referring to FIG. 1, a layer (or film) of sterol 10 capable of polymerizing to form a structure of etch-resistant polymer is deposited on a previously cleaned face 12 of a substrate 14.

Figure 2:
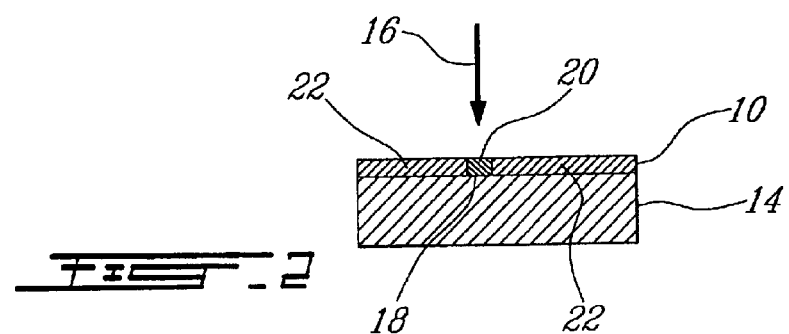
FIG. 2 is a cross sectional view of the substrate and layer of sterol of FIG. 1, showing the formation of a polymer structure within the layer of sterol by means of an electron beam.

Turning to FIG. 2, an electron beam 16 is generated and applied to a predetermined region 18 of the layer of sterol 10 to locally break chemical bonds in the sterol molecules, leaving free radicals to form bonds between the molecules, thus forming an etch-resistant polymer 20. The electron beam 16 can be a focused or shaped electron beam.

Figure 3:
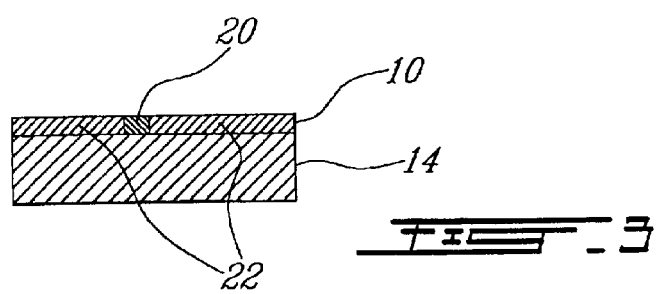
FIG. 3 is a cross sectional view of the substrate and layer of sterol of FIG. 1, showing a polymer structure that has been formed on the substrate.

With reference to FIG. 3, the region 18 exposed to the electron beam 16 (exposed region 18) has been transformed into a structure of etch-resistant polymer 20 due to the above-mentioned polymerization of the sterol molecules with each other.

With respect to FIG. 4, the region(s) of the layer of sterol 10 that was not exposed to the electron beam 16, hereinafter referred to as the unexposed region(s) 22 (see FIGS. 2 and 3) are removed.

Figure 4:
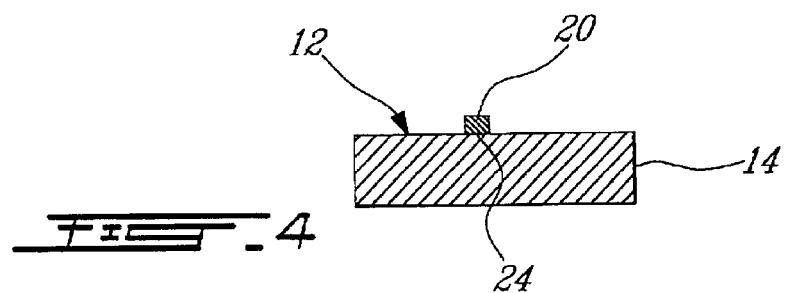
FIG. 4 is a cross sectional view of the substrate and layer of sterol of FIG. 1, in which the unexposed region of the layer of sterol has been dissolved by, for example, a wet solution to leave only the polymer structure on the substrate.
Figure 5:
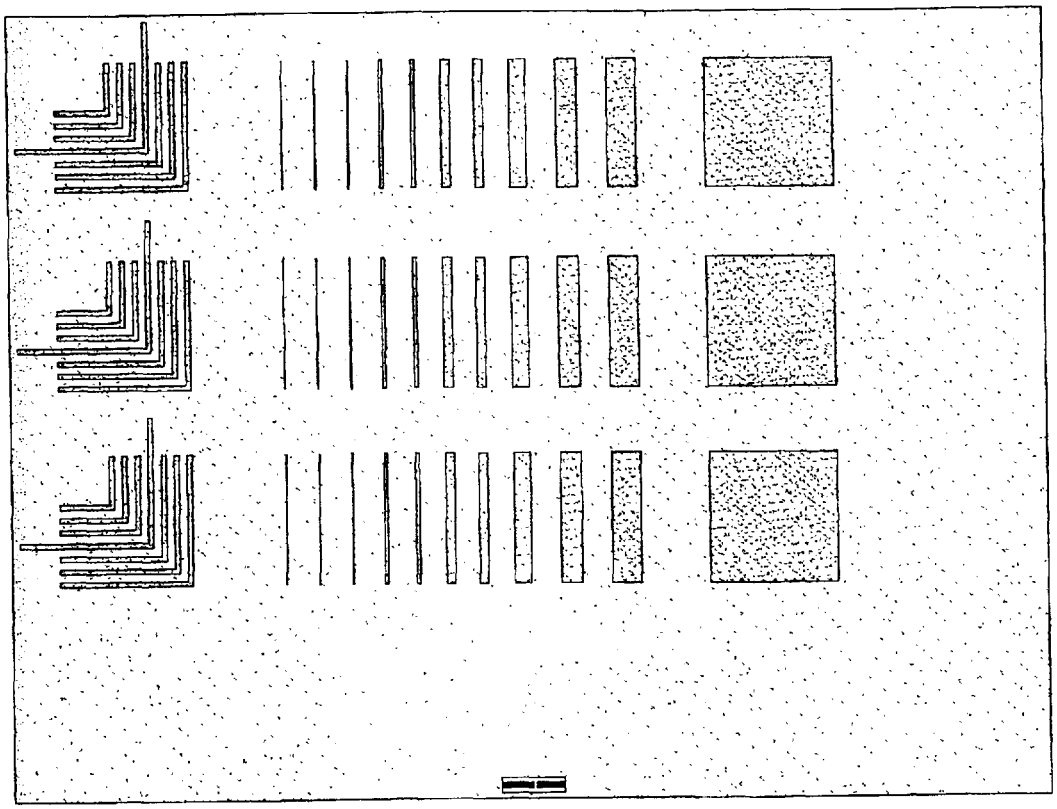
FIG. 5 is a micrograph showing polymer structures formed from a layer of cholesterol on a top face of a substrate of nickel, after dissolution of the unexposed region of the cholesterol layer.

According to another illustrative embodiment, exposure to the electron beam 16 and removal of the unexposed region 22 of the layer of sterol 10 can be followed by etching of the face 12 of the substrate 14 using plasma or a wet solution except in the region protected by the structure 24 of etch-resistant polymer 24 (see FIG. 4). When etching of the face 12 has been completed, the polymerized sterol structure 24 can be removed using oxygen plasma.

With respect to the above-described illustrative embodiments, what follows is a brief description of some non-limitative, exemplary features given for the purpose of illustration only.

The sterol of the layer 10 can be selected from the group consisting of: agnosterol, avenasterol, brassicasterol, campesterol, cholesterol, ergosterol, lanosterol, lathosterol, lumisterol, sitosterol, stigmastanol, and combinations thereof.

The substrate 14 may be made of silicon, metal, etc.

The layer of sterol 10 may be deposited onto the face 12 of the substrate 14 by a deposition method such as evaporation, Langmuir-Blodgett deposition, spin coating, dip coating, or any other suitable technique.

The electron beam 16 may be focused through a series of electromagnetic lenses or electrostatic lenses in order to achieve a minimal beam size on the surface of the sample. Alternatively, it may be shaped by projection through a stencil to project a corresponding shape on the surface of the sample. The use of a focused or shaped electron beam 16 enables the production of a structure 24 of etch-resistant polymer 20 of sub-micrometer scale resolution, particularly having linewidths smaller than 100 nm and specifically as small as 50 nm. The etch-resistant polymer structure 24 may be formed, for example, of ultra-narrow lines of etch-resistant polymer onto the face 12 of the substrate 14. The electron beam 16 may also be displaced, for example, under the control of a computer to expose a desired pattern or patterns and to imprint this(ese) pattern(s) into the layer of sterol 10.

Removal of the unexposed region(s) 22 may be accomplished by dissolving this(ese) region(s) through a wet solvent solution. For example, the sample of FIG. 3 can be immersed into a solvent solution capable of dissolving the layer of sterol 10 but incapable of dissolving the structure 24 of etch-resistant polymer 20. The wet solution may be selected from the group consisting of: ethers, alcohols, acetone, methyl ethyl ketone, methyl isobutyl ketone, benzene, chlorobenzene, ethylbenzene, xylene, toluene, trichloroethylene, chloroform, cellosolve, ethyl acetate, butyl acetate, ethylenediamine, and combinations thereof. After this dissolution, only the region of the layer of sterol 10 (structure 24) having been exposed to the electron beam 16 will remain on the face 12 of the substrate 14.

The invention will be further illustrated by the following non-limitative examples:

EXAMPLE 1

In this first example, the method in accordance with the present invention will be applied to the production of masks for X-ray lithography.

The fabrication of X-ray masks for industrial applications requires the patterning of 300 nm to 500 nm thick refractory metal films with high X-ray absorption coefficient. From the industrial standpoint, tantalum, tantalum silicide, tungsten and tungsten silicide are usually chosen to form such absorber layer. To satisfy industrial requirements, the patterns are usually required to present a resolution better than 100 nm. In order to achieve this resolution, electron beam lithography is used to define the pattern onto an electron sensitive resist applied on top of the absorber layer.

The pattern is then transferred to an intermediary layer in between the patterned resist layer on top and the X-ray absorber layer underneath. This intermediary layer is usually made of SiON, $SiO_2$, or of a metal with an etch chemistry different from the etch chemistry of the absorber layer; such metal may include, for example, nickel or chromium. The pattern is transferred from the resist to the intermediary layer by using plasma or a wet etching solution that will remove this layer, except in the region protected by the resist pattern.

The pattern is finally transferred from the intermediary layer to the absorber layer by a reactive ion etching plasma, which removes the absorber layer in the region left unprotected by the etch of the intermediary layer.

As a specific example, a 2-$\mu$m thick silicon nitride membrane is covered with a 50-nm chromium film, followed by a 300-nm tantalum film, both deposited by argon sputtering. The tantalum film is then covered by a 20-nm nickel film deposited by thermal evaporation.

In order to perform dip coating, a solution of 1% of cholesterol in isopropyl alcohol is prepared. The mask blank is then dipped into the solution and pulled out of the solution at a regular slow speed, leaving a 60-nm thick layer of cholesterol on the dried surface. Electron beam lithography is performed on this cholesterol film using a highly focused electron beam, at 3 keV. Exposure doses above 500 $\mu C/cm^2$ are used, creating a sufficient amount of broken chemical bonds in the cholesterol molecules which leaves free radicals cross linking the molecules, forming an etch-resistant polymer in the exposed region(s). These structures of polymer cannot be dissolved in common solvents and resist most acid solutions. Lithography is carried out using a JEOL-6300 Scanning Electron Microscope equipped with a beam blanker. The position of the beam during the patterning process in externally controlled by the Nanometer Pattern Generation System by J. C. Nabity Lithography systems, that writes the different elements of the desired pattern by displacing the beam on the layer of cholesterol. The pattern corresponds to the pattern to be projected by the X-ray mask.

After exposure, the mask is dipped into an isopropyl alcohol solution, in order to remove the unexposed region(s) of the layer of cholesterol. The exposed region(s), being polymerized, is(are) not soluble in this solution and therefore remain intact. The mask is dried using nitrogen.

The mask is then dipped into a nitric acid solution in order to remove the thin film of nickel, except in the region(s) protected by the polymerized cholesterol. The sample is then cleaned and dried.

The mask is then processed in a reactive ion etching system, with a mixture of $SF_6$ and $CH_4$, with a RF power of 80 Watts. The tantalum film is etched to the bottom, except in the region(s) protected by the nickel. The etching conditions are such that the tantalum structure defined by this plasma etching has vertical sidewalls. The mask is water cooled during the etching process in order to avoid fractures or deformations of the membrane. The layer of chromium acts as a barrier to the etching plasma. The chromium layer can then be removed, if needed, by wet etching using a ceric amonium nitrate and perchloric acid solution.

FIG. 6 shows elements of an X-ray mask fabricated using this method.

The interest of sterols as electron beam sensitive resists for the fabrication of such masks comes from the excellent resistance of the sterol and sterol polymers to protic solvents, such as the acid solutions used to transfer the pattern from the resist polymer pattern to the underlying intermediary layer (nickel). The sterols, as part of the lipids, are generally not soluble in protic solvents, which prevents the patterned sterol polymer from being dissolved or damaged during wet etching of the intermediary layer. Also, in the case of X-ray masks, the substrate is a membrane of the order of 2-$\mu$m thick. Spin-coating involves high speed of rotation and induces vibrations susceptible to cause fractures in the material of membrane and produce mechanical stresses that will cause errors in the image placement of the pattern. This is a critical issue related to the use of this technology in the industry. Contrary to conventional resists that require to be spin-coated, sterols can be either evaporated or spin coated, eliminating those problems.

In a similar manner, masks for electron projection lithography and masks for extreme ultraviolet lithography can be fabricated by substituting the tantalum layer with another type of layer having absorption characteristics appropriate for the given technology.

EXAMPLE 2

In this second example, the method in accordance with the present invention will be applied to the production of masks for deep ultraviolet photolithography.

The fabrication of masks for deep ultraviolet lithography (DUV), requires high-resolution patterning of a layer of absorber such as chromium, especially for the optical proximity correction patterns that are used to improve the resolution of the DUV lithography systems.

For the fabrication of a DUV mask according to this second example, a 80-nm thick chromium absorber layer or film is deposited by evaporation on top of a quartz plate.

A solution of 1% of cholesterol dissolved in methyl ethyl ketone is prepared. This solution is used to spin coat at 5000 rpm the electron sensitive, resist cholesterol layer on top of the chromium layer using conventional spin-coating equipment. Contrary to conventional resists, no baking of the electron sensitive cholesterol layer is required after this layer has been spun. In order to achieve sub-500 nm resolution, electron beam lithography is used to define the pattern within the electron sensitive resist layer on top of the absorber layer. Electron beam lithography is performed at energies above 2 keV in order to inject electrons deep enough to transform the entire thickness of the layer of cholesterol into a structure of etch-resistant polymer. Exposure doses increase as a function of the energy, so typically, energies from 3 to 5 keV are chosen.

After exposure, the mask is dipped into a methyl ethyl ketone solution, in order to remove the unexposed region(s) of the layer of cholesterol. The exposed region(s), being polymerized, is(are) not soluble in this solution and therefore remain(s) intact.

The sample is then dipped into a chromium etching solution of ceric ammonium nitrate and perchloric acid, dissolved in water. This solution removes completely the chromium layer, except in the region protected by the resist pattern. The region(s) unexposed to the electron beam therefore become(s) clear fields in the masks.

The mask can finally be cleaned using an oxygen plasma etching system, which will remove the polymerized cholesterol structure without damaging the underlying chromium layer.

EXAMPLE 3

In this third example, the method in accordance with the present invention will be applied to the production of gates for transistors by direct electron beam lithography.

For the fabrication of, for example, MOSFET transistor gates using the present technology, a poly-crystalline silicon (poly-Si) layer is deposited by LPCVD (Low Pressure Chemical Vapor Deposition) on top of an oxide layer on a silicon substrate. A pattern in the oxide layer was previously used to define the transistor channels between the sources and the drains of the transistors.

A 50-nm thick layer of cholesterol is then evaporated on top of the poly-Si layer, using conventional Joule effect evaporation under vacuum with controlled deposition parameters (deposition rate, temperature, pressure) optimized in order to achieve a surface of cholesterol both uniform and free of morphology defects. Lithography is performed using a shaped beam lithography system. In such a system, a large and unfocused electron beam is projected through a stencil mask that absorbs the electrons, except in the open areas (holes) of the mask.

The pattern defined by these holes is then projected onto the layer of cholesterol. In the region(s) where electrons are projected in that manner, the electrons break bonds in the cholesterol molecules, leaving free radicals to cross-link the molecules, thus forming a structure of etch-resistant polymer. The entire pattern can be either formed by scanning a large electron beam over a complex stencil mask containing the different elements of the pattern, or by projecting the beam through a simple mask onto different areas of the wafer.

Once the lithography is completed, the wafer is dipped into an isopropyl alcohol solution for several minutes in order to remove completely the unexposed region(s) of the layer of cholesterol.

The wafer is then rinsed in water, dried with nitrogen, and dipped into a solution of HF and $HNO_3$, diluted in water. This removes completely the poly-Si, except in region(s) protected by the polymerized cholesterol structure, thus defining the gates of the transistors.

Finally, the etch-resistant polymer can be removed using oxygen plasma, also cleaning the wafer from residues from wet etching solutions.

It is to be understood that the invention is not limited in its application to the details of construction and parts illustrated in the accompanying drawings and described hereinabove. The invention is capable of other embodiments and of being practised in various other ways. It is also to be understood that the phraseology or terminology used herein is for the purpose of description and not limitation. Hence, although the present invention has been described hereinabove by way of illustrative embodiments and examples thereof, it can be modified at will, within the scope of the appended claims, without departing from the spirit and nature of the subject invention.

What is claimed is:

1. A method of producing a structure of etch-resistant polymer on a substrate, comprising:
    (a) depositing on a face of the substrate a layer of sterol capable of polymerizing to form the structure of etch-resistant polymer;
    (b) exposing a first region of the layer of sterol to an electron beam to locally polymerize the layer of sterol and form the structure of etch-resistant polymer;
    (c) removing a second region of the layer of sterol which has not been exposed to the electron beam to leave on the face of the substrate only the structure of etch-resistant polymer; and
    (d) etching an area of the face of the substrate not covered by the structure of etch-resistant polymer.

2. A method according to claim 1, further comprising:
    (e) removing the structure of etch-resistant polymer when etching of the face of the substrate has been completed.

3. A method, of producing a pattern etch-resistant polymer structures on a substrate, comprising:
    (a) depositing on a face of the substrate a layer of sterol capable of polymerizing to form the structure of etch-resistant polymer:
    (b) exposing a first region of the layer of sterol to an electron beam to locally polymerize the layer of sterol and form the structure of etch-resistant polymer wherein exposing the first region of the layer of sterol comprises exposing different areas of the layer of sterol to form a pattern of etch-resistant polymer structures; and
    (c) removing a second region of the layer of sterol which has not been exposed to the electron beam to leave on the face of the substrate only the structure of etch-resistant polymer.

4. A method according to claim 1, wherein etching the face of the substrate comprises exposing said area of the face of the substrate not covered by the structure of etch-resistant polymer to a plasma.

5. A method according to claim 1, wherein etching the face of the substrate comprises exposing said area of the face of the substrate not covered by the structure of etch-resistant polymer to a wet solvent solution.

6. A method according to claim 2, comprising using oxygen plasma to remove the structure of etch-resistant polymer.

7. A method of producing on a substrate a mask for lithography, comprising:
    (a) depositing on a face of the substrate a radiation-absorbing layer;
    (b) depositing on the radiation-absorbing layer a layer of sterol capable of polymerizing;
    (c) exposing a first region of the layer of sterol to an electron beam to locally polymerize the layer of sterol and form a structure of etch-resistant polymer;
    (d) removing a second region of the layer of sterol which has not been exposed to the electron beam to leave on the radiation-absorbing layer only the structure of etch-resistant polymer; and
    (e) etching from the face of the substrate a region of the radiation-absorbing layer not covered by the structure of etch-resistant polymer.

8. A method according to claim 7, further comprising:
    (f) removing the structure of etch-resistant polymer when the region of the radiation-absorbing layer not covered by the structure of etch-resistant polymer has been removed.

9. A method of producing on a substrate a mask for X-ray lithography, comprising:
    (a) depositing on a face of the substrate a first layer of etch-resistant material forming a first barrier to a particular etching process;
    (b) depositing on the first layer a second layer of X-ray absorbing material;
    (c) depositing on the second layer a third layer of etch-resistant material forming a second barrier to said particular etching process;
    (d) depositing on the third layer a layer of sterol capable of polymerizing;
    (e) exposing a first region of the layer of sterol to an electron beam to locally polymerize the layer of sterol and form a structure of etch-resistant polymer;
    (f) removing a second region of the layer of sterol which has not been exposed to the electron beam to leave on the third layer only the structure of etch-resistant polymer;
    (g) etching a region of the third layer not covered by the structure of etch-resistant polymer; and
    (h) removing, by means of said particular etching process, a region of the second layer not covered by the structure of etch resistant polymer.

* * * * *